(12) United States Patent
El Daif et al.

(10) Patent No.: US 7,729,043 B2
(45) Date of Patent: Jun. 1, 2010

(54) NEAR INFRARED TWIN PHOTON SOURCE (75) Inventors: Ounsi El Daif, Renens (CH); Augustin Baas, Lausanne (CH); Benoît Deveaud-Plédran, Lausanne (CH); François Morier-Genoud, Villeneuve (CH)

(73) Assignee: École Polytechnique Fédérale de Lausanne, Lausanne (CH)

( * ) Notice: Subject to any disclaimer, the term of this patent is extended or adjusted under 35 U.S.C. 154(b) by 0 days.

(21) Appl. No.: 11/699,948

(22) Filed: Jan. 30, 2007

(65) Prior Publication Data
US 2007/0177253 A1 Aug. 2, 2007

(30) Foreign Application Priority Data
Jan. 30, 2006 (EP) .................. 06001889

(51) Int. Cl.
G02F 1/35 (2006.01)
G02F 2/02 (2006.01)

(52) U.S. Cl. ........................................ 359/330
(58) Field of Classification Search ......... 359/326–330; 372/92
See application file for complete search history.

(56) References Cited

U.S. PATENT DOCUMENTS
5,848,086 A * 12/1998 Lebby et al. ........... 372/46.013

OTHER PUBLICATIONS
Wenkai et al, Dynamics of Cavity Polaritons in a GaAs Quantum-well Semiconductor Microcavity, Acta Photonica Sinica, vol. 34, No. 5, May 2005, pp. 793-796.*
Diederichs et al, "Design for a triply resonant vertical-emitting micro-optical parametric oscillator", Applied Physics Letters 87, Dec. 16, 2005, pp. 251107, 251107-2, 251107-3.*
Balili, R B, et al., "Actively tuned and spatially trapped polaritons", Applied Physics Letters AIP USA, Jan. 16, 2006, pp. 31110-1, vol. 88, No. 3.
Baumberg, J J, et al., "Parametric oscillation in a vertical microcavity: a polariton condensate or micro-optical parametric oscillation", Physical Review, B. Condensed Matter, American Institute of Physics, Dec. 15, 2000, pp. 16247-16250, vol. 62, No. 24.
Dasbach, G, et al., "Parametric polariton scattering in microresonators with three-dimensionsal optical confinement", Physical Review, B. Condensed Matter and Materials Physics, APS through AIP USA, Oct. 26, 2001, pp. 201309/1-4, vol. 64, No. 20.
Dasbach, G, et al., "Polarization inversion via parametric scattering in quasi-one-dimensional microcavities", Physical Review, B. Condensed Matter and Materials Physics, APS through AIP USA, Apr. 15, 2005, pp. 161308-1, vol. 71 No. 16.
El Daif, O, et al., "Polariton quantum boxes in semiconductor microcavities", Applied Physics Letters, Feb. 7, 2006, pp. 061105-1-061105-3, vol. 88.
Lu, D, et al., "All-epitaxial mode-confined vertical-cavity surface-emitting laser" Applied Physics Letters AIP USA, Sep. 20, 2004, pp. 2169-2171, vol. 85, No. 12.
Lugan, P, et al., "Theory of trapped polaritons in patterned microcavities", Proceedings of the 8th international conference on nonlinear optics and excitations kinetics in semiconductors (Noeks-8), Feb. 20, 2006, Retrieved from the internet, URL: http://arxiv.org/pdf/cond-mat/0602628.

* cited by examiner

Primary Examiner—Hemang Sanghavi
(74) Attorney, Agent, or Firm—Saliwanchik, Lloyd & Saliwanchik (57) ABSTRACT

Optical parametric oscillator including a semiconductor microcavity being configured to spatially localize polaritons of at least three quantized polariton energy levels to effect an optical parametric oscillation.

21 Claims, 5 Drawing Sheets

NEAR INFRARED TWIN PHOTON SOURCE

FIELD OF INVENTION

The invention relates to a new optical semiconductor device and in particular to a micro optical parametric oscillator.

BACKGROUND

Optical parametric oscillators (OPOs) are frequently used as tunable infrared light sources. Conventionally they are realized by an optically pumped laser cavity including a nonlinear crystal. The parametric oscillation is effected by irradiating the nonlinear crystal with an intense pump beam having a frequency $v_3$. In the nonlinear crystal quantum correlated photons of frequencies $v_1$ and $v_2$ are generated spontaneously by parametric scattering according to the relation $v_3=v_1+v_2$, wherein $v_1$ is the photon frequency. The generated modes are denoted as signal and idler modes.

Conventional OPOs usually require a lengthy and inconvenient initial alignment procedure and during their operation a continuous feedback control of the cavity length in order to compensate for cavity length fluctuations. Furthermore, in OPOs of this conventional type signal and idler photonic emissions comprise strongly unequal intensities.

BRIEF SUMMARY OF INVENTION

It is the object of the present invention to provide an optical parametric oscillator and a corresponding method of providing optical parametric oscillations that are easy to realize and that include signal and idler modes of comparable signal intensities.

This object is achieved by an optical parametric oscillator including a semiconductor microcavity being configured to spatially localize a polariton and at least three quantized polariton levels to effect an optical parametric oscillation and a method of providing two beams of correlated photons, including the steps: providing a semiconductor microcavity being configured to spatially localize a polariton and including at least three quantized polariton levels to effect an optical parametric oscillation; and irradiating one of said quantized microcavity polariton levels to generate two beams of correlated photons by optical parametric oscillation.

According to the invention an optical parametric oscillator is provided which includes a semiconductor microcavity configured to spatially localize polaritons and at least three quantized polariton levels. On these levels optical parametric oscillations corresponding to the relation $2\times v_3=v_1+v_2$ can be effected by irradiating the semiconductor microcavity with a pump beam having a frequency $v_3$ and an intensity above the parametric threshold. In the relation $v_1$ and $v_2$ are the polariton frequencies of the quantum correlated signal and idler mode, respectively.

Contrary to the scattering process according to the relation $v_3=v_1+v_2$ described above, in a microcavity according to the present invention preferably two polaritons are scattered into a signal and idler polariton.

The microcavity provided in the optical parametric oscillator according to the present invention permits the formation of quasi-particles called polaritons, consisting of the superposition of an exciton, i.e. a two-particle state of a correlated electron-hole pair in a quantum well and a photon. In order to permit the existence of polaritons in the strong photonic-excitonic coupling regime, the length of the cavity between the reflectors is determined so that a microcavity photonic mode with a frequency close or identical to the emission frequency of an exciton in the quantum well can be formed. Preferably, the cavity length corresponds to an integer multiple of the wavelength of radiation emitted by an exciton formed in the quantum well.

"Spatial localization" in the context of the present invention means the formation of a preferably three dimensional quantum confinement of a polariton or an optical polariton excitation in a microcavity.

In the oscillator microcavity zero-dimensional cavity polaritons with several quantized excitation levels can exist. Since the polariton parametric amplification takes place on energy levels having an identical or similar spectral separation, three spectrally equally or almost equally separated levels are selected among the quantized excitation levels, wherein the intermediate level is used as the pump level, while the two other levels are used for the signal and idler modes of the parametric oscillation.

As the signal and idler levels have similar photonic components differing by a few percent only as can be shown by a full calculation of the localized polariton states in a microcavity, and the signal and idler levels are equally populated due to quantum correlation or entanglement, respectively, the signal and idler modes photonic emissions comprise approximately the same intensities. According to one embodiment of the invention the two optical output beams include simultaneously emitted photons comprising correlated polarizations.

Although the use of three equally spaced levels is preferred for the optical parametric oscillations, the optical parametric oscillator can also be operated at energy levels which are not equally separated, as long as the relation $2\times v_3=v_1+v_2$ is met. This, however, will cause an increase of the parametric threshold.

According to a preferred embodiment of the invention the microcavity of the optical parametric oscillator comprises two reflectors, at least one semiconductor layer separating said reflectors and a semiconductor quantum well wherein at least one of said reflectors and said at least one semiconductor layer comprises a structure which is adjusted to spatially localize a polariton in said microcavity.

According to a further preferred embodiment a structure to spatially localize a polariton is realized by a microcavity comprising at least one region having a different cavity length than a portion of said microcavity surrounding said region. By locally changing the length of the cavity photonic modes existing inside and outside said region comprise different wavelengths and energies. Thus a localizing structure or potential well for the light is realized. Due to the preferred configuration of the microcavity for the strong exciton-phonon coupling regime, these traps at the same time define "polariton traps" in which polaritons are localized or spatially confined and which comprise several quantized polariton levels.

The localization strength and positions of the energy levels of the trapped zero dimensional polaritons depend on the lateral size and depth of the trap. The localization strength and the spectral separation between the energy levels increases both with a decreasing dimension of the region in which the cavity length is changed and also with the amount of change of the cavity length, i.e. the depth of the trap.

Contrary to the embodiment as described above, a localization of polaritons in a microcavity structure could also be achieved by reducing the lateral dimensions of a microcavity, e.g. by an etching process, and without locally changing the cavity length. However, due to the interaction of the excitonic part of the polariton with the outside environment of the microcavity (e.g. the surrounding air) polaritons in such a structure would exhibit a reduced lifetime which in turn results in broadened linewidths of the polaritons and thus an overlap and disappearance of the quantized levels.

According to a further embodiment a local change of the length of the cavity is achieved by providing at least one reflector and/or semiconductor layer in said cavity which comprises a raised or recessed region in one of the surfaces perpendicular to the longitudinal dimension of the microcavity to locally change and preferably increase the length of the cavity in that region. Such a structure can be fabricated by lithographic and etching techniques commonly used in semiconductor technology. It is preferred to obtain a cavity with a locally modified length by preparing a spacer layer of the microcavity with a raised region on top of which further semiconductor layers e.g. of a Bragg mirror are grown.

According to a preferred embodiment at least one of said reflectors is a Bragg reflector including a sequence of alternating semiconductor layers having different band gaps. Bragg reflectors can conveniently be formed using well known semiconductor fabrication technologies. The raised region in the spacer layer is preferably transferred to the semiconductor layers of the Bragg reflector subsequently grown on top of it. Alternatively a raised or recessed region could be formed in one of the layers of the Bragg reflector. In addition, it can also be taken into account to provide a layer including a raised or projecting region on both sides of the microcavity with the raised structures oppositely oriented towards the respective end of the microcavity.

The raised or recessed region can comprise a circular, polygonal or elliptical shape. It preferably includes a width and/or length of less than 5 μm, preferably of less than 2 μm and particularly preferred of less than 1 μm and a height or depth of more than 1.5%, preferably of more than 5% and particularly preferred of more than 10% of the cavity length for a microcavity based on GaAs and AlGaAs. It may vary for other materials.

The microcavity as well as the layer including a raised or recessed region is preferably produced with semiconductor growth and lithographic processing techniques such as molecular beam epitaxy (MBE) or metal organic chemical vapors deposition (MOCVD) or others. Suitable materials for the microcavity include III-V semiconductors such as GaAs and AlGaAs. This permits an easy fabrication of devices including slight local variations of the cavity length. For example, an optical parametric oscillator working in the near infrared requires a cavity comprising a length in the order of a few microns. In such a cavity variations of the cavity length of a few nanometers are sufficient to obtain a significant localization effect.

Since the fabrication process of the microcavity can be based on known lithography techniques it is well controllable and the optical parametric oscillator devices are reproducible to a very high degree. The raised region which is preferably transferred to the top layer of the cavity and thus identifiable can be used for alignment purposes of the microcavity with other devices such as an optical fiber.

The optical parametric oscillator according to the invention has the further advantage that it comprises a monolithic structure already including the reflectors. Thus basically neither an alignment nor a feedback control of the cavity is necessary. The optical parametric oscillator according to the invention can be used in quantum cryptography applications or for quantum information protocols.

The optical parametric oscillator can also be provided as a part of an optical device including a pump laser source that is adjusted to emit radiation corresponding to one of said quantized microcavity polariton levels onto said optical parametric oscillator. The pump laser source can be a continuously operating or a pulsed laser. According to another preferred embodiment said pump laser source is capable to emit polarized light such as circularly or linearly polarized light.

The present invention also includes a method of providing two beams of correlated photons. According to the method a semiconductor microcavity is provided which is configured to localize a polariton and which comprises at least three quantized polariton levels for optical parametric oscillations.

Furthermore, the method includes a step of emitting radiation corresponding to one of said quantized microcavity polariton levels on said microcavity in order to generate two beams of correlated photons by optical parametric oscillation. Radiating a pump laser beam having a frequency $v_3$ corresponding to the pump polariton level causes the generation of quantum correlated signal and idler beams at frequencies $v_1$ and $v_2$ according to the relation $2 \times v_3 = v_1 + v_2$.

Preferably, among the polariton levels three levels are selected that are spectrally equally or almost equally separated, wherein the intermediate level is used as the pump level, while the other levels correspond to the signal and idler modes of the parametric oscillation. This permits to generate signal and idler emissions including strongly correlated photons and having similar or even identical photonic components and intensities.

According to one embodiment the method can include a step of forming said microcavity with at least one region having a different cavity length than a portion of said microcavity surrounding said region. Due to the local change of the length of the cavity a polariton can be localized without reducing or negatively influencing its lifetime and the spectral linewidth of its photonic part. The depth of the "potential trap" for the polaritons is directly defined by the change of the length of the cavity.

Preferably, the microcavity is configured with a length that corresponds to an integer multiple of the wavelength of radiation emitted by an exciton formed in said quantum well.

According to still another embodiment the step of forming the microcavity can include forming at least one of said reflectors and said semiconductor layers with a raised or recessed region in one of their surfaces to change the length of the microcavity in said region. Furthermore, the method can include lithography techniques using a stop etch layer.

Preferably, a cooling means such as a cryostat is provided to cool the optical parametric oscillator to an appropriate temperature. Preferred temperatures are below 273 K, below 70 K or below 10 K.

Further aspects and objects of the present invention will result from the following description of a preferred embodiment of the invention in conjunction with accompanying drawings, in which:

DETAILED DISCLOSURE

Figure 1:
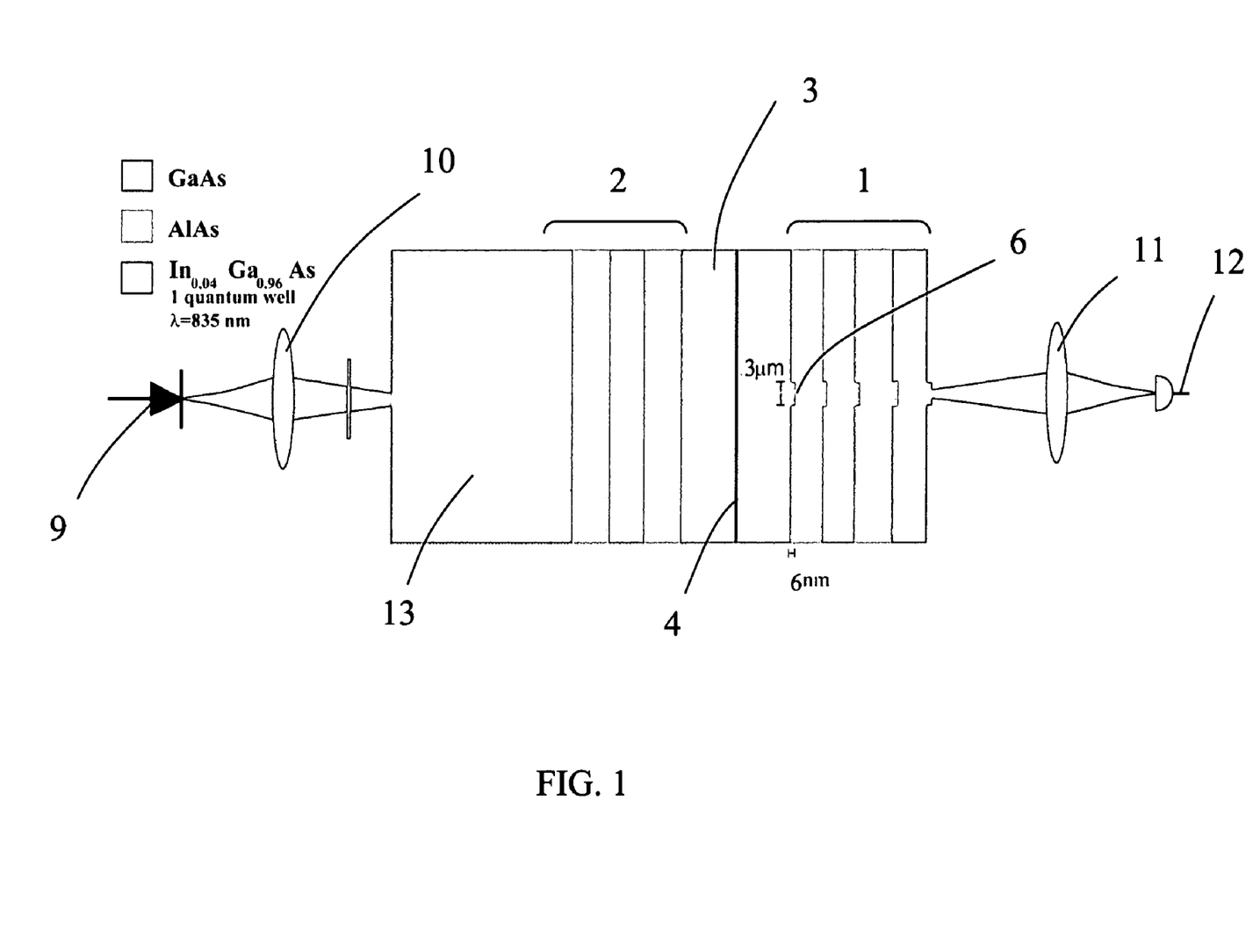
FIG. 1 is a schematic view of an optical device including an optical parametric oscillator structure according to one embodiment of the invention.

An optical parametric oscillator structure according to one embodiment of the invention is shown in FIG. 1. It includes a microcavity comprising two Bragg reflectors 1, 2 formed of alternating layers of GaAs and AlAs. The Bragg reflectors 1, 2 are separated by two semiconductor layers 3 of GaAs that surround a single quantum well 4 of $In_{0.04}Ga_{0.96}As$. Its fundamental energy level corresponds to a wavelength of 835 nm. The quantum well is slightly doped (14%) with In which allows to excite the microcavity through the GaAs substrate and to collect the light in transmission.

The distance between the Bragg reflectors corresponds to the wavelength of the fundamental quantum well level. Thus, the formation of a polariton, i.e. the superposition of a photon and an exciton in the strong coupling regime is granted. The semiconductor layers are sequentially grown on a substrate 13 using molecular beam epitaxy (MBE). For the purpose of illustration only a reduced number of the semiconductor layers of the actually grown microcavity and of the semiconductor layers forming the Bragg reflectors 1, 2 are shown. At least one of the Bragg reflectors comprises a reflectivity of more than 99.5%. The microcavity can also include more than one quantum well. However, the number of quantum wells is not critical for the invention.

As it is visible in FIG. 1, the semiconductor layer 3 which is positioned on top of the InGaAs quantum well includes a raised region 6 having a diameter of about 3 μm in its upper surface 8. The raised portion 6 is prepared by a masking and etching technique including a stop etch spacer layer. Since additional semiconductor layers which are e.g. part of the Bragg reflector 1 are subsequently grown on the semiconductor layer 3 the thickness change in the region 6 is transferred through all subsequent layers and into the topmost layer.

Due to the raised region in the otherwise flat surface of the spacer layer 3 and also in the Bragg reflector 1, the length of the cavity locally changes. The local change of the length of the cavity results in a local trap for polaritons. Since the lateral extension of the microcavity has been determined sufficiently large an interaction of one or several trapped polaritons with the area outside the microcavity can be strongly reduced or excluded. Therefore, no reduction of the polariton lifetime or a corresponding overlap between the quantized polariton levels occurs.

A standard semiconductor laser diode 9 which serves as an excitation source is collinearly aligned with the longitudinal direction of the microcavity. Between the laser diode 9 and the substrate 13 an interference filter 10 is arranged to obtain a spectral linewidth of the order of about 100 microeV. Collinearly with the microcavity a collecting lens 11 and an optical fiber 12 are arranged to collect and guide photons emitted from the microcavity.

Once a set of three polariton levels is chosen for a parametric oscillation according to the relation $2\times v_3 = v_1 + v_2$, the pump mode $v_3$ of the device is excited by focusing an excitation beam from the diode 9 on the polariton trap, which is easily identified by a reflectivity experiment or by an image of the surface of the sample, as the small potential well for the light is visible on the surface of the top Bragg mirror.

Above the non linear threshold of the parametric polariton oscillation, which is very low (of the order few Watt per $cm^2$), signal and idler modes are emitted preferentially in transmission. Accordingly, the number of Bragg mirrors pairs on both sides of the microcavity is unbalanced to force emission in one of the microcavity directions and avoid the losing of signal-idler photon pairs. In the case of the present embodiment 12 Bragg mirrors (1) were grown on the emitting side of the microcavity, while 22 Bragg mirrors (2) were provided on the other side.

Depending on the configuration as used the photons of the signal-idler pairs can be spectrally separated or isolated according to their polarization.

The device can be operated in the continuous or pulsed wave regime. The entanglement of quantum correlated beams produced in the case of the continuous wave regime can be evidenced by noise measurement on the beam, a standard way of evidencing quantum correlations in the field of quantum optics. This configuration is useful for quantum information protocols with continuous variables. In the pulsed regime, a number of correlated signal-idler photon pairs is emitted per pulse.

In both cases the signal and idler emissions have the same intensity, since the polariton modes have the same photonic component. This permits to attenuate both emissions in the same way without losing the correlation. Thus even single correlated photon pairs can be obtained.

The photonic components of the signal and idler emissions can be evaluated by a full calculation of the localized polariton states in the polariton trap. As a result of the calculation it can also be shown that the situation of a microcavity including "localized polaritons" as in the case of the present invention significantly differs from the situation of "non localized polaritons" in a conventional planar microcavity. While in the case of "localized polaritons" according to the present invention approximately the same photonic components and intensities for the signal and idler emissions are obtained, the Hopfield coefficients of the signal and idler modes are very different in the case of a conventional planar cavity, leading to a very poor outcoupling of the idler emission.

Furthermore, the device of the present invention can be operated in two different configurations with respect to the polarization of the excitation source 9. For a circularly polarized beam from the excitation source 9, the parametric effect, that conserves the spin, produces correlated signal and idler pairs that are polarized in the same way as the excitation pump beam. According to quantum entanglement with respect to intensity an equal number of photons in each beam is obtained.

Figure 2:
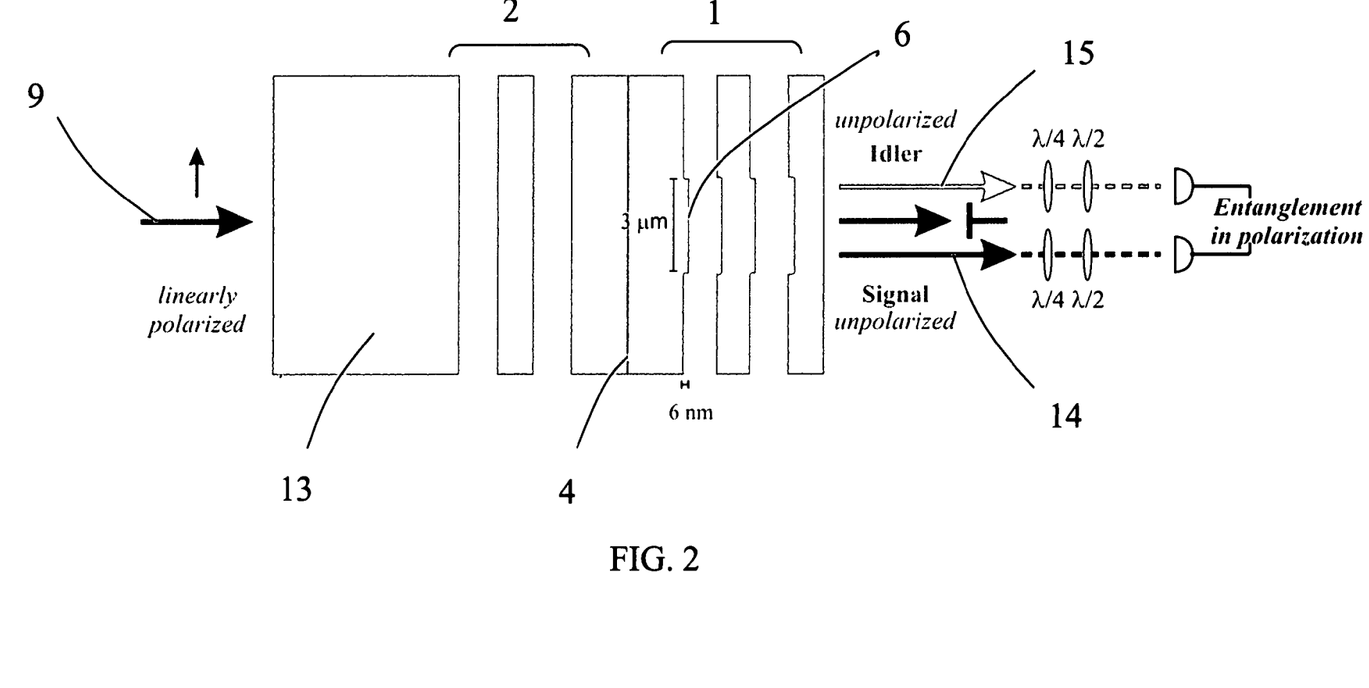
FIG. 2 is a schematic view of an experimental set up in the polariton entanglement configuration including the optical parametric oscillator structure to the embodiment shown in FIG. 1.

For a linearly polarized excitation pump beam, signal 14 and idler 15 pairs will be totally unpolarized. However, quantum entanglement will reflect itself in photon pairs including correlated photons having the same polarization, as is shown in FIG. 2. Furthermore, also in the case of this configuration the intensities of the signal and idler beam are approximately equal because the signal land idler levels have similar photonic components. The entanglement of the correlated photons can be evidenced by arranging combinations of a quarter wave plate and a half-wave plate in each of the output beams.

Figure 3:
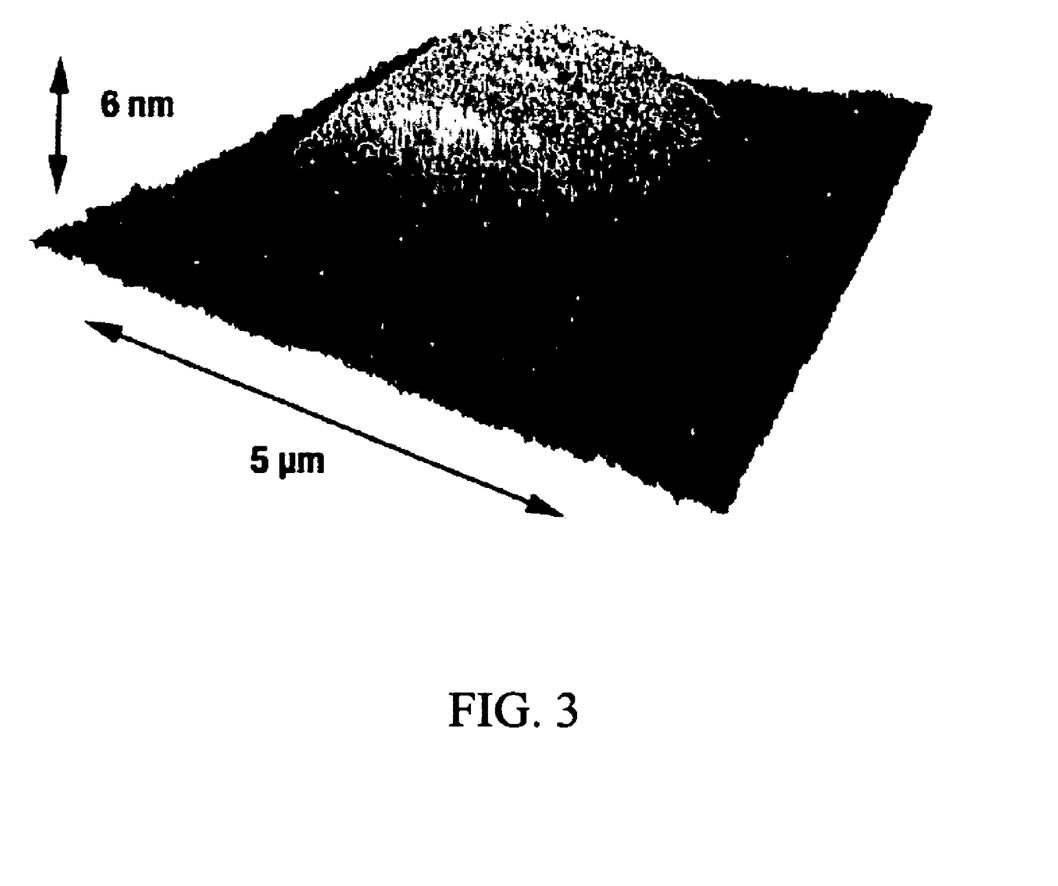
FIG. 3 shows an AFM image of a layer of the microcavity of FIG. 1 with a 3μ diameter polariton trap.

FIG. 3 shows an atomic force microscope (AFM) characterization of an actually prepared microcavity sample and in particular of a spacer layer 3 before applying layers of a Bragg reflector. The raised area or mesa structure has a width of about 5 μm and a height of 6 nm and comprises an approximately hemispherical shape. Since this structure appears on the surface of the topmost layer or the microcavity, a proper alignment of the sample is facilitated as has been indicated above. The lateral dimension of the microcavity (perpendicular to the cavity length) is about 100 μm. However, this value is not critical as long as it is significantly larger than the size of the localizing structure or "polariton trap".

Figure 4A:
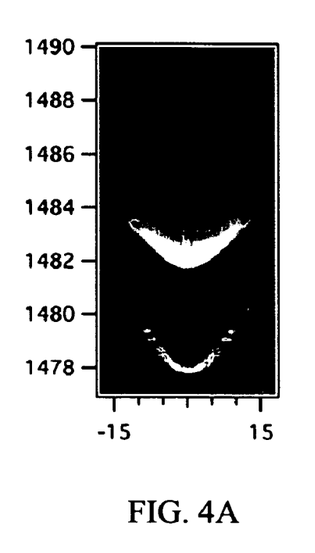
FIGS. 4(a)-(c) show k-space emissions from different microcavity samples including trap sizes of 20 (FIG. 4a), 10 (FIG. 4b), and 3 (FIG. 4c) μm, respectively.
Figure 4B:
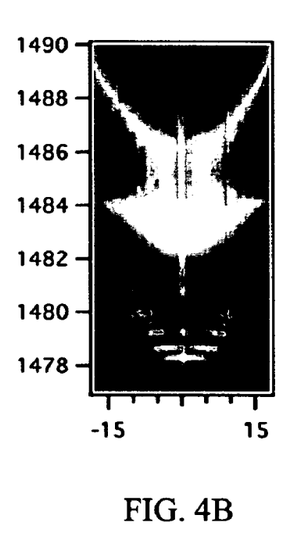
Figure 4C:
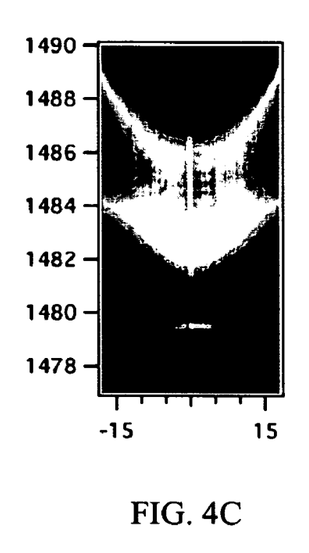

FIGS. 4a-c show measured images of the reciprocal space (k-space) of microcavities including a structure according to the embodiment shown in FIG. 1 with raised regions or polariton traps of 20, 10 and 3 μm, respectively, and a height of the structure (or trap depth) of 6 nm obtained by Fourier imaging of the microcavity emission. The excitation spot of the used laser was 100 μm in diameter and thus larger than the trap sizes. This method could also be used to determine the quantized levels used for optical parametric oscillations in the parametric oscillator of the invention.

Figure 5:
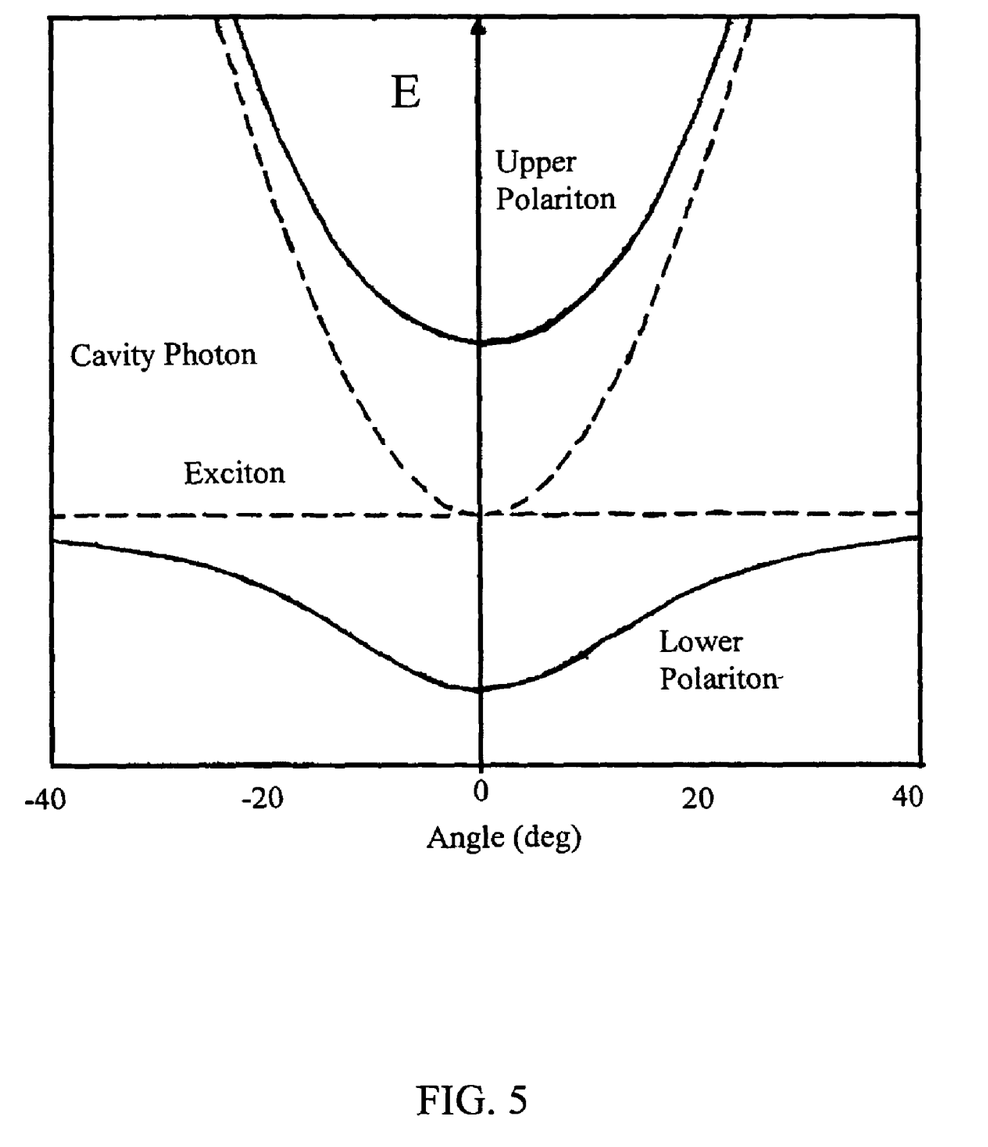
FIG. 5 diagrammatically shows the dispersion of a microcavity polariton.

In the case of the smallest trap size (FIG. 4c) quantized polariton energy levels can be observed between 1479 and 1482 nm. The lowest energy state corresponds to a polariton deeply trapped in the microcavity and shows a linewidth of less than 100 μeV. This linewidth corresponds to a polariton lifetime of the order of 10 ps. No overlap between the spectral lines of the quantized polariton energy states is observed. Instead the levels can be clearly identified. Due to the used spot size with a diameter of 100 μm both polaritons outside the trap and the polaritons in the trap are observed. Correspondingly to the polaritons outside the trap a standard dispersion curve corresponding to a microcavity without a localizing structure is observed in the spectrum at wavelengths above 1482 nm. This dispersion basically corresponds to the theoretical curve for a microcavity without any localizing structure shown by the unbroken lines in FIG. 5. The dispersion curve in FIG. 5 shows a degeneration of the energy states at the crossing point of the parabola like dispersion curve of photon in the cavity and the straight dispersion of an exciton in the quantum well (dashed lines).

In the case of larger traps (FIGS. 4a and 4b) the quantum levels cannot be observed, due to a smaller localization effect and an insufficient spacing between the energy levels which is equal or less than the spectral linewidth of the polariton.

The device shown in FIG. 1 can also be easily integrated into an array of twin emitters which each preferably includes a localization region (polariton trap). Such a multiple twin emitter array could be fabricated by a single fabrication process using semiconductor lithography techniques and combined with an appropriate number of optic fibers into an optical telecommunication device.

The above example refers to a sample based on GaAs and AlGaAs and photon beams at about 1480 nm. However, the present invention can also be applied to other materials and wavelengths without departing from the concept of the invention.

The features disclosed in the description, the claims and the drawings can be of importance for the present invention either alone or in any combination thereof.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

The invention claimed is:

1. An optical parametric oscillator, comprising a semiconductor microcavity being configured to permit the existence of a polariton and comprising a structure to spatially localize the polariton in said microcavity, wherein said microcavity comprises at least three quantized excitation levels of the polariton on which an optical parametric oscillation can be effected by said spatially localized polariton.

2. The optical parametric oscillator according to claim 1, wherein the at least three quantized excitation levels comprise three equally or almost equally spectrally separated quantized excitation levels for an optical parametric oscillation and wherein the semiconductor microcavity emits correlated signal and idler photon modes having similar intensities.

3. The optical parametric oscillator according to claim 1, wherein said semiconductor microcavity comprises two reflectors, at least one semiconductor layer separating said two reflectors and a semiconductor quantum well, wherein at least one of said two reflectors and of said at least one semiconductor layer comprises a structure which is adjusted to localize a polariton in said semiconductor microcavity.

4. The optical parametric oscillator according to claim 2, wherein said semiconductor microcavity comprises two reflectors, at least one semiconductor layer separating said two reflectors and a semiconductor quantum well, wherein at least one of said two reflectors and of said at least one semiconductor layer comprises a structure which is adjusted to localize a polariton in said semiconductor microcavity.

5. The optical parametric oscillator according to claim 1, wherein said semiconductor microcavity comprises at least one region having a different cavity length than a portion of said semiconductor microcavity surrounding said at least one region.

6. The optical parametric oscillator according to claim 2, wherein said semiconductor microcavity comprises at least one region having a different cavity length than a portion of said semiconductor microcavity surrounding said at least one region.

7. The optical parametric oscillator according to claim 3, wherein said semiconductor microcavity comprises at least one region having a different cavity length than a portion of said semiconductor microcavity surrounding said at least one region.

8. The optical parametric oscillator according to claim 3, wherein at least one of said two reflectors or said at least one semiconductor layer comprises a raised or recessed region in one of its surfaces to change a cavity length of the semiconductor microcavity in said raised or recessed region.

9. The optical parametric oscillator according to claim 3, wherein a cavity length of said semiconductor microcavity is adjusted to form a microcavity photon mode having a frequency equal or close to an integer multiple of an emission frequency of an exciton in said semiconductor quantum well.

10. The optical parametric oscillator according to claim 7, wherein a cavity length of said semiconductor microcavity is adjusted to form a microcavity photon mode having a frequency equal or close to an integer multiple of an emission frequency of an exciton in said semiconductor quantum well.

11. The optical parametric oscillator according to claim 8, wherein the cavity length of said semiconductor microcavity is adjusted to form a microcavity photon mode having a frequency equal or close to an integer multiple of an emission frequency of an exciton in said semiconductor quantum well.

12. An optical device, comprising:
an optical parametric oscillator, wherein the optical parametric oscillator comprises a semiconductor microcavity being configured to permit the existence of a polariton and comprising a structure to spatially localize the polariton in said microcavity, wherein said microcavity comprises at least three quantized excitation levels of the polariton on which an optical parametric oscillation can be effected by said spatially localized polariton; and a pump laser source adjusted to emit radiation corresponding to one of the quantized excitation levels onto said optical parametric oscillator.

13. The optical device according to claim 12, wherein the semiconductor microcavity comprises three equally or almost equally spectrally separated quantized excitation levels for an optical parametric oscillation and wherein the semiconductor microcavity emits correlated signal and idler photon modes having similar intensities.

14. The optical device according to claim 12, wherein said semiconductor microcavity comprises two reflectors, at least one semiconductor layer separating said two reflectors and a semiconductor quantum well, wherein at least one of said two reflectors and of said at least one semiconductor layer comprises a structure which is adjusted to localize a polariton in said semiconductor microcavity.

15. The optical device according to claim 12, wherein said semiconductor microcavity comprises at least one region having a different cavity length than a portion of said semiconductor microcavity surrounding said at least one region.

16. The optical device according to claim 14, wherein at least one of said two reflectors or said at least one semiconductor layer comprises a raised or recessed region in one of its surfaces to change a cavity length of the semiconductor microcavity in said raised or recessed region.

17. The optical device according to claim 14, wherein a cavity length of said semiconductor microcavity is adjusted to form a microcavity photon mode having a frequency equal or close to an integer multiple of an emission frequency of an exciton in said semiconductor quantum well.

18. A method of providing two beams of correlated photons, comprising:
providing a semiconductor microcavity being configured to permit the existence of a polariton and comprising a structure to spatially localize the polariton in said microcavity, wherein said microcavity comprises at least three quantized excitation levels of the polariton on which an optical parametric oscillation can be effected; and
irradiating one of the quantized excitation levels to generate a spatially localized polariton and two beams of correlated photons by optical parametric oscillation of the spatially localized polariton.

19. The method according to claim 18, wherein the at least three quantized excitation levels comprise three equally or almost equally spectrally separated quantized excitation levels for an optical parametric oscillation and wherein the semiconductor microcavity emits correlated signal and idler modes having similar intensities.

20. The method according to claim 18, wherein said semiconductor microcavity comprises at least one region having a different cavity length than a portion of said semiconductor microcavity surrounding said at least one region.

21. The method according to claim 19, wherein said semiconductor microcavity comprises at least one region having a different cavity length than a portion of said semiconductor microcavity surrounding said at least one region.

* * * * *